(12) United States Patent
Kwon et al.

(10) Patent No.: US 6,518,660 B2
(45) Date of Patent: Feb. 11, 2003

(54) SEMICONDUCTOR PACKAGE WITH GROUND PROJECTIONS

(75) Inventors: Heung Kyu Kwon, Seongnam (KR); Tae Je Cho, Asan (KR); Young Hoon Ro, Cheonan (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/017,801

(22) Filed: Dec. 12, 2001

(65) Prior Publication Data
US 2002/0113306 A1 Aug. 22, 2002

(30) Foreign Application Priority Data
Feb. 19, 2001 (KR) .......................................... 2001-8149

(51) Int. Cl.[7] .......................... H01L 23/12; H01L 23/52
(52) U.S. Cl. ....................... 257/704; 257/691; 257/783; 257/778
(58) Field of Search ................................ 257/704, 691, 257/783, 678, 778, 693, 786, 791; 438/125, 118

(56) References Cited
U.S. PATENT DOCUMENTS

| | | | | |
|---|---|---|---|---|
| 4,410,905 A | * | 10/1983 | Grabbe | 174/52 FP |
| 5,258,576 A | * | 11/1993 | Newman et al. | 174/52.4 |
| 5,763,824 A | * | 6/1998 | King et al. | 174/35 R |
| 5,901,050 A | * | 5/1999 | Imai | 361/820 |
| 6,084,297 A | * | 7/2000 | Brooks et al. | 257/698 |
| 6,349,033 B1 | * | 2/2002 | Dubin et al. | 361/704 |
| 6,351,194 B2 | * | 2/2002 | Takahashi et al. | 257/700 |
| 6,225,694 B1 | * | 5/2002 | Terui | 257/704 |

* cited by examiner

*Primary Examiner*—Jasmine J B Clark
(74) *Attorney, Agent, or Firm*—Harness, Dickey & Pierce, P.L.C.

(57) ABSTRACT

A semiconductor package includes: a substrate having an upper surface and a lower surface; an integrated circuit chip having bond pads; a lid attached on the upper surface of the substrate so as to cover the chip; and one or more projections that electrically connect the lid to a plurality of ground patterns. The substrate has substrate pads formed on the upper surface, and one or more of the substrate pads extend to form the ground patterns. The chip is bonded on the upper surface of the substrate. One or more of the bond pads are ground bond pads, and the bond pads are electrically connected to the corresponding substrate pads. An electrically nonconductive adhesive is used for the attachment of the lid to the substrate, and the projections are connected to the ground patterns by an electrically conductive adhesive. The ground projections are positioned at four corners of a cavity that is formed between the substrate and the lid. The semiconductor package further includes: external connection terminals formed on the lower surface of the substrate and electrically connected to the corresponding substrate pads; and a thermal interface material is interposed between lid and the chip, the thermal interface material transmitting heat generated by the chip to the lid.

15 Claims, 3 Drawing Sheets

SEMICONDUCTOR PACKAGE WITH GROUND PROJECTIONS

BACKGROUND OF THE INVENTION

1. Field of the Invention

The present invention relates to the field of semiconductor manufacturing and more particularly to a semiconductor package with a lid.

2. Description of Related Art

Wire bonding is commonly used for making electrical connections between an integrated circuit chip and a substrate. However, when the chip is intended for high electrical performance, a flip-chip bonding is often used instead of the wire bonding. In addition, when the chip needs extensive cooling, a lid is often attached on the back of the chip to improve heat removal from the chip.

FIGS. 1 and 2 show a conventional semiconductor package 100 with a lid 40. Solder bumps 24 of a central processing unit (CPU) chip 20 are bonded by flip-chip bonding to corresponding substrate pads 16 on an upper surface 12 of a ceramic substrate 10. The solder bumps 24 are external terminals of the CPU chip 20, and the substrate pads 16 are electrically connected to external connection pins 30 which are on the bottom surface of the substrate 10. The lid 40 is attached to the upper surface 12 of the substrate 10 to cover the CPU chip 20. A flip-chip bonding part between the CPU chip 20 and the ceramic substrate 10 is filled with an encapsulant.

The lid 40, which is made of a material having a good heat conductivity, such as Al or Cu, includes a cavity 48 for receiving the CPU chip 20. In order to maximize the heat removal through the lid 40, a thermal interface material 56 is interposed between an inner bottom surface of the cavity 48 of the lid 40 and the back surface of the CPU chip 20. A nonconductive thermosetting silicon adhesive 54 is used for attaching the lid 40 to the upper surface of the ceramic substrate 10. The nonconductive thermosetting silicon adhesive 54 is cured to complete the attachment between the lid 40 and the ceramic substrate 10.

The electrically nonconductive thermosetting silicone adhesive 54 provides excellent adhesion between the ceramic substrate 10 and the lid 40, and serves as a buffer for absorbing the stresses due to the difference of Coefficient of Thermal Expansion (CTE) between the ceramic substrate 10 and the lid 40.

However, the above-described conventional semiconductor package 100 has a drawback in that this structure cannot sufficiently cope with Electromagnetic Interference (EMI). That is, after mounting the semiconductor package 100 on an electronic system, the semiconductor package 100 is often exposed to EMI generated by operation of the electronic system. This EMI may cause error in the operation of the CPU chip 20 or lower its performance.

In order to overcome the EMI problem, the metallic lid is grounded by replacing the conventional electrically nonconductive adhesive for attaching the lid to the substrate with an electrically conductive adhesive. For example, an electrically conductive thermosetting silicon adhesive or a solder may be used as the electrically conductive adhesive.

The electrically conductive thermosetting silicone adhesive performs the buffer function of reducing the stresses between the lid and the substrate. However, the electrically conductive thermosetting silicone adhesive does not produce good adhesion between the ceramic substrate and the lid. In contrast, the solder provides excellent adhesion between the That is, when solder is used, cracks or delaminations may be caused at the interface between the lid and the ceramic substrate due to thermal stresses. Such cracks can degrade the heat removal capacity of the package and further degrade electrical performance of the chip.

SUMMARY OF THE INVENTION

In accordance with an embodiment of the present invention, a semiconductor package includes: a substrate having an upper surface and a lower surface; an integrated circuit chip having bond pads; a lid attached on the upper surface of the substrate so as to cover over the chip; and one or more projections that electrically connect the lid to one or more ground patterns.

The substrate has substrate pads formed on the upper surface, and one or more of the substrate pads extend to form ground patterns. The chip is bonded on the upper surface of the substrate. The chip can be electrically connected to the substrate pads by a wirebonding method or by a flipchip bonding method. One or more of the bond pads are ground bond pads, and the bond pads are electrically connected to the corresponding substrate pads. In one embodiment, an electrically nonconductive adhesive is used for the attachment of the lid to the substrate, and the projections are connected to the ground patterns by an electrically conductive adhesive. The ground projections may be positioned at one or more of the four corners of a cavity that is formed between the substrate and the lid.

The semiconductor package further includes: external connection terminals formed on the lower surface of the substrate and electrically connected to the corresponding substrate pads; and a thermal interface material interposed between lid and the chip, the thermal interface material transmitting heat generated by the chip to the lid.

BRIEF DESCRIPTION OF THE DRAWINGS

The features and advantages of the present invention will be readily understood with reference to the following detailed description thereof provided in conjunction with the accompanying drawings, wherein like reference numerals designate like structural elements, and, in which.

DETAILED DESCRIPTION

Figure 4:
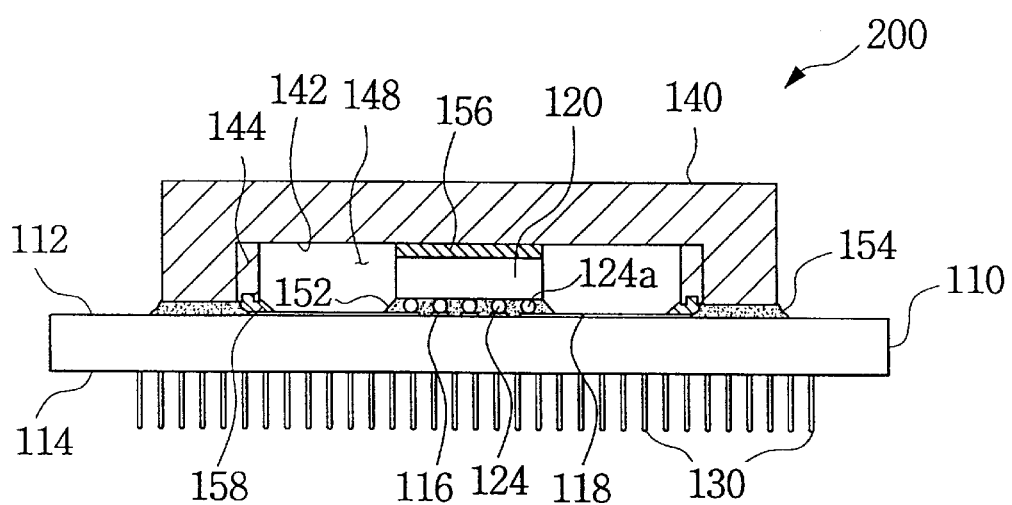
FIG. 4 is a cross-sectional view taken along the line II—II of FIG. 3.
Figure 3:
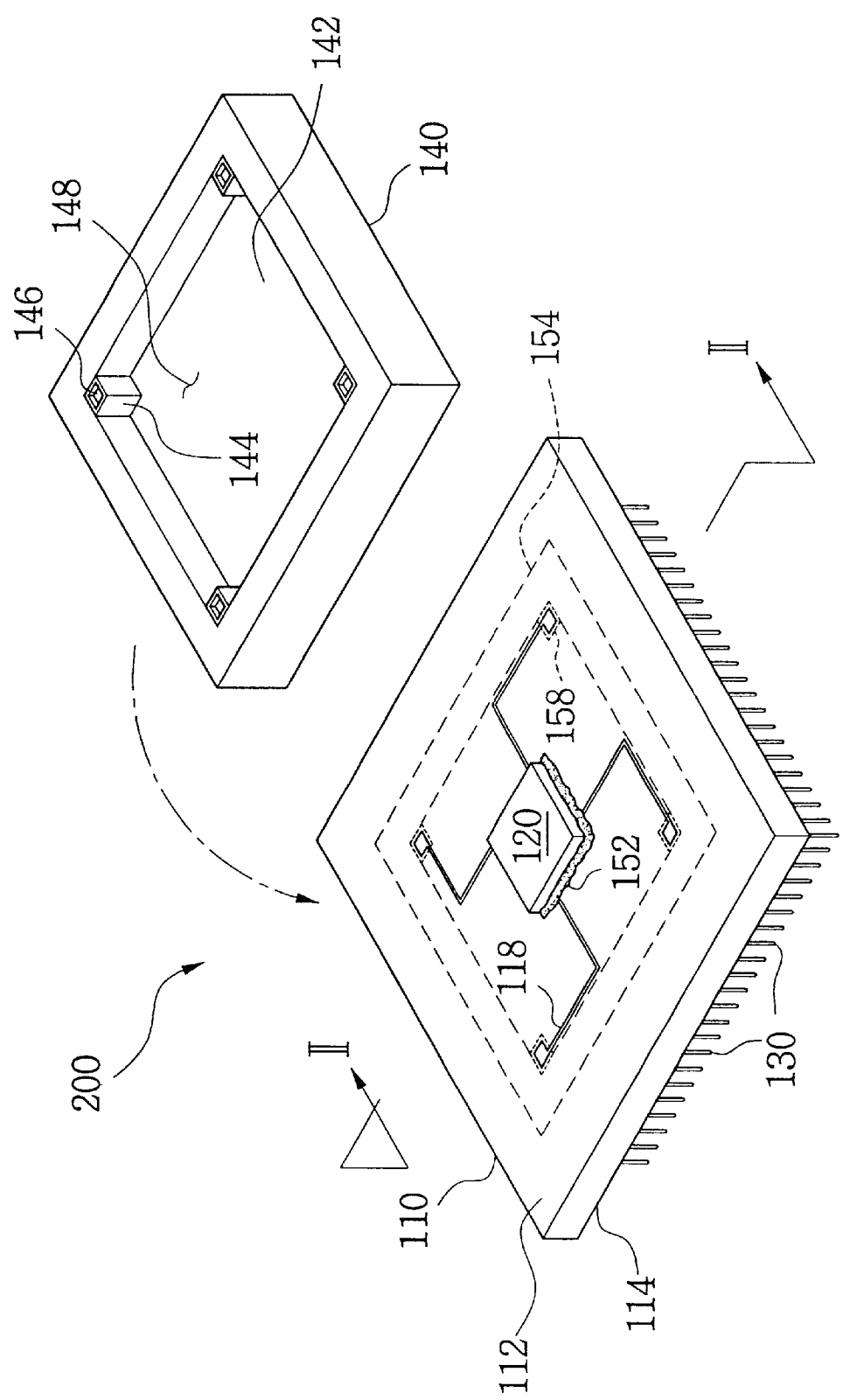
FIG. 3 is a perspective view of a semiconductor package with a lid in accordance with the present invention.

FIG. 3 is a perspective view of a semiconductor package 200 with a lid 140 in accordance with the present invention. FIG. 4 is a cross-sectional view taken along the line II—II of FIG. 3.

Referring to FIGS. 3 and 4, an integrated circuit chip 120 is flip-chip bonded on an upper surface 112 of a substrate 110, so that solder bumps 124 of the chip 120 are bonded to corresponding substrate pads 116, which are circuit patterns, on the upper surface 112 of substrate 110. The solder bumps 124 are connected to corresponding bond pads (not shown) of chip 120. The substrate 110 can be a printed circuit board or a ceramic board. The lid 140 is attached to the upper surface 112 of the substrate 110, thereby covering the chip 120. External connection terminals 130 on a lower surface 114 of the substrate 110 are, through circuit patterns (not shown) formed in or on the substrate 110, electrically connected to the corresponding substrate pads 116. Although being in pin shape in FIG. 3, the external connection terminals 130 may be any viable shapes such as a ball or column. The space between the chip 120 and the substrate is filled with an encapsulant 152.

The flip-chip bonding of the chip 120 is carried out by a reflow process at a temperature of about 350° C. to 360° C. for approximately 100 seconds. The encapsulant 152, such as liquid epoxy resin, fills the space between the chip 120 and the substrate 110, and is cured at the temperature of about 70° C. to 100° C. for approximately 180 seconds. Herein, one or more of solder bumps 124 are ground bumps 124a, and one or more of the substrate pads 116 are for the ground bumps 124a, which electrically connect to ground bond pads (not shown) of the chip 120. The substrate pads for the ground bumps 124a are extended to ground patterns 118 on the upper surface 112 of the substrate 110. Thus, the ground bumps 124a electrically connect to the ground patterns 118.

After the bonding of the chip 120 to the substrate 110 and the curing of the encapsulant 152, the lid 140 is bonded over the chip 120 to the upper surface 112 of the substrate 110. The lid 140 is made of a conductive metal having excellent thermal conductivity, such as Cu, CuW, AlSiC, etc, and coated with a conductive metal such as Ni, Au, Ag, Sn, Cr, etc. The lid 140 has a cavity 148 for receiving the chip 120.

In order to maximize heat removal form the chip 120 through the lid 140, a thermal interface material 156 is interposed between an inner surface 142 of the cavity 148 of the lid 140 and a back surface of the chip 120. The lid 140 is attached to the upper surface 112 of the substrate 110 by an electrically nonconductive adhesive 154. A electrically nonconductive thermosetting silicon adhesive can be used as the electrically nonconductive adhesive 154. In bonding the lid 140 to the substrate 110, the electrically nonconductive adhesive 154 is applied on the outer portion of the upper surface 112 of the substrate 110, and the lid 140 is mounted on the upper surface 112 of the substrate 110. Then, the electrically nonconductive adhesive 154 is cured, thereby hermetically sealing the chip 120 within the cavity 142. The curing (hardening) process of the electrically nonconductive adhesive 154 is performed at the temperature of about 100° C. to 150° C. for approximately 1 hour.

Referring to FIG. 3, the lid 140 includes four ground projections 144 at the four corners of the cavity 148. The ground projections 144 are electrically connected to the lid 140 and can be integrated as part of lid 140 or attached to the lid 140. The number and location of the ground projections can be varied according to the number and location of the ground patterns 118. The ground projections 144 are formed so as to contact, via electrically conductive adhesive 158, the ground patterns 118 on the upper surface 112 of the substrate 110 when the lid 140 covers the chip 120. When the lid 140 is bonded to the substrate 110, the ground projections 144 are electrically connected to the ground patterns 118 by the electrically conductive adhesive 158 which is applied on parts of the ground patterns 118. Each of the ground projections 144 may have a groove 146 where the ground projections 144 meet the ground patterns 118, thereby increasing the adhesion between the ground projections 144 and the ground patterns 118.

An electrically conductive thermosetting silicon adhesive, a conductive epoxy adhesive, a solder film, or a solder paste may be used as the electrically conductive adhesive 158. When the electrically conductive thermosetting silicon adhesive is used, the curing of the electrically conductive thermosetting silicon adhesive and the curing of the electrically nonconductive adhesive 154 can be performed simultaneously.

Figure 1:
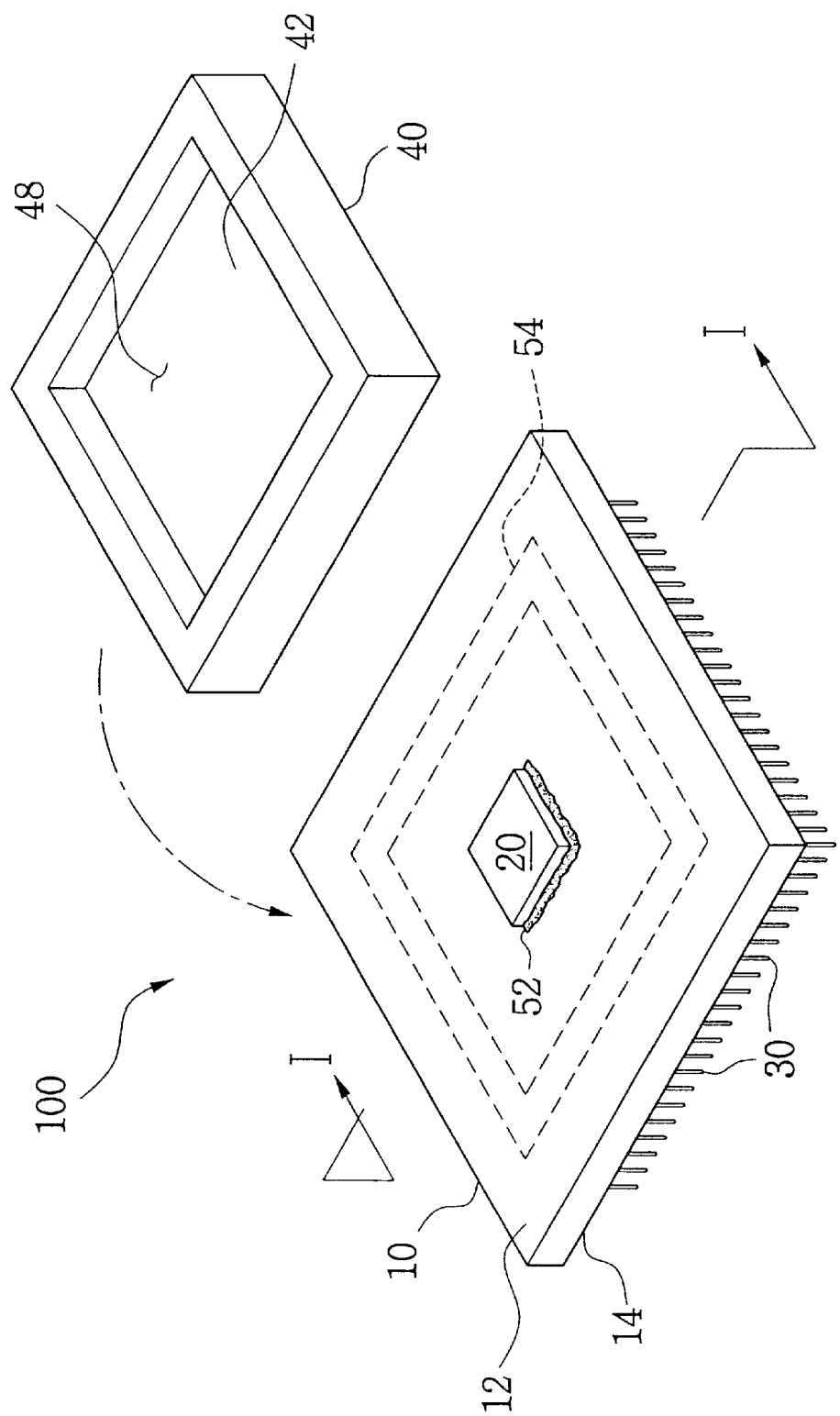
FIG. 1 is a perspective view of a conventional semiconductor package with a lid.
Figure 2:
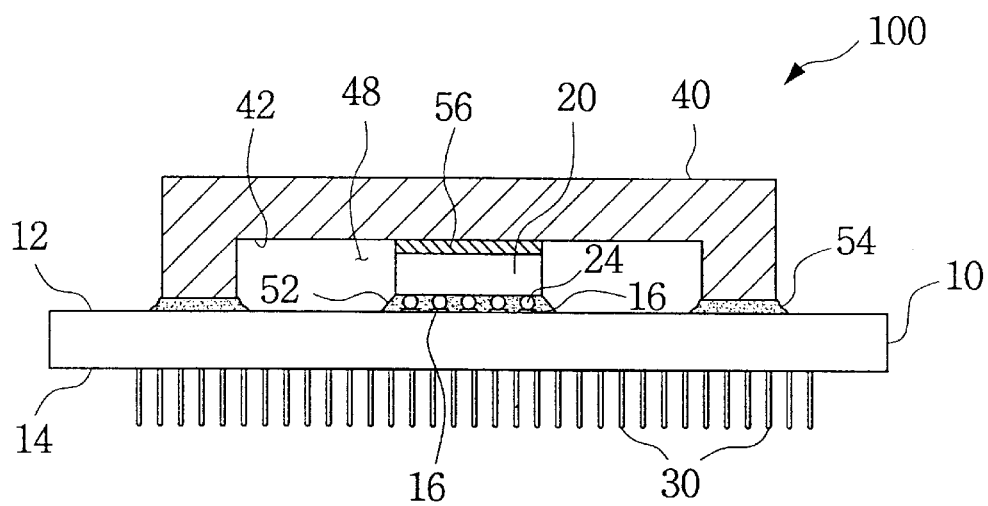
FIG. 2 is a cross-sectional view taken along the line I—I of FIG. 1.

The semiconductor package according to the present invention uses the electrically nonconductive adhesive to attach the lid to the substrate, and a small amount of electrically conductive adhesive only to connect the ground projections of the lid to the substrate. Thus, the cracks or delaminations that are often caused in a semiconductor package that bonds its lid on the substrate by an electrically conductive adhesive may not occur in the semiconductor package of the present invention. The electrically conductive adhesive prevents EMI problems that often occur in the conventional semiconductor package of FIG. 1. The ground projections 144 of the lid which are connected to the ground patterns by the electrically conductive adhesive ground the lid. In addition, the good adhesion without the delaminations between the lid and the substrate maintains the sealing of the chip under the lid.

Although the embodiment of the present invention is of a semiconductor package structure with a lid on the upper surface of the substrate, in order to improve the heat removal capacity, a heat sink may be attached to the upper surface of the lid. Further, in order to emit gas generated during the hardening process of the conductive adhesive and the nonconductive adhesive, through holes (not shown) may be formed in the lid.

Since the semiconductor package of the present invention blocks electromagnetic waves at the package level, the present invention has more flexibility in preventing EMI noise in terms of the substrate design.

Although certain embodiments of the present invention have been described in detail hereinabove, it should be understood that many variations and/or modifications of the basic inventive concepts herein taught which may appear to those skilled in the art will still fall within the spirit and scope of the present invention as defined in the appended claims. For example, the chip without the solder bumps can be wirebonded on the substrate with the bond pads of the chip facing up, and the thermal interface material can be applied between the chip and the lid. In this case, the ground bond pads of the chip are wirebonded to the ground patterns of the substrate.

What is claimed is:

1. A semiconductor package comprising:
   a substrate having an upper surface and a lower surface, wherein a plurality of substrate pads are on the upper surface, and one or more of the plurality of substrate pads extend to form a ground pattern;
   an integrated circuit chip having a plurality of bond pads, one or more of the plurality of the bond pads being a ground bond pad, wherein the chip is bonded on the upper surface of the substrate, and the plurality of the bond pads are electrically connected to corresponding substrate pads; and
   a lid attached to the upper surface of the substrate thereby to cover the chip, wherein the lid defines a ground projection that projects into a cavity defined between the upper surface of the substrate and the lid and electrically connects the lid to the ground pattern, and wherein the ground projection is connected to the ground pattern by an electrically conductive adhesive.

2. The semiconductor package of claim 1, further comprising a plurality of external connection terminals on the lower surface of the substrate and electrically connected to the corresponding substrate pads.

3. The semiconductor package of claim 1, wherein the package defines a ground projection at each of four corners of the cavity between the substrate and the lid.

4. The semiconductor package of claim 1, wherein a groove is defined on a bottom surface of the ground projection.

5. The semiconductor package of claim 1, wherein the conductive adhesive is one selected from the group consisting of a conductive thermosetting silicone adhesive, a conductive epoxy adhesive, a solder paste, and a solder film.

6. The semiconductor package of claim 1, wherein the chip is electrically connected to the substrate pads by wirebonds.

7. The semiconductor package of claim 1, wherein the chip is electrically connected to the substrate by flipchip bonds.

8. The semiconductor package of claim 1, wherein the lid is of metal.

9. The semiconductor package of claim 1, further comprising a heat sink attached to the lid.

10. The semiconductor package of claim 1, wherein the lid is coated with metal.

11. The semiconductor package of claim 1, further comprising an electrically nonconductive adhesive interposed between the upper surface of the substrate and the lid.

12. The semiconductor package of claim 2, further comprising a thermal interface material interposed between the lid and the chip, whereby the thermal interface material transmits heat generated by the chip to the lid.

13. The semiconductor package of claim 11, wherein the electrically nonconductive adhesive is a thermosetting silicone adhesive.

14. A semiconductor package comprising:

a substrate having an upper surface and a lower surface, wherein a plurality of substrate pads are on the upper surface, and one or more of the plurality of substrate pads extend to form a ground pattern;

an integrated circuit chip having a plurality of bond pads, one or more of the plurality of the bond pads being a ground bond pad, wherein the chip is bonded on the upper surface of the substrate, and the plurality of the bond pads are electrically connected to corresponding substrate pads; and a lid attached to the upper surface of the substrate thereby to cover the chip, wherein the lid defines a ground projection at each of four corners of a cavity between the substrate and the lid, and the ground projections electrically connect the lid to the ground pattern, and wherein the ground projections are connected to the ground pattern by an electrically conductive adhesive.

15. A semiconductor package comprising:

a substrate having an upper surface and a lower surface, wherein a plurality of substrate pads are on the upper surface, and one or more of the plurality of substrate pads extend to form a ground pattern;

an integrated circuit chip having a plurality of bond pads, one or more of the plurality of the bond pads being a ground bond pad, wherein the chip is bonded on the upper surface of the substrate, and the plurality of the bond pads are electrically connected to corresponding substrate pads; and a lid attached to the upper surface of the substrate thereby to cover the chip, wherein the lid defines a ground projection that projects into a cavity defined between the upper surface of the substrate and the lid and electrically connects the lid to the ground pattern, and wherein the ground projection is connected to the ground pattern by an electrically conductive adhesive, wherein a groove is defined in a bottom surface of the ground projection.

* * * * *